United States Patent [19]

Hillmer

[11] Patent Number: 5,600,743

[45] Date of Patent: Feb. 4, 1997

[54] OPTOELECTRONIC MULTI-WAVELENGTH COMPONENT

[75] Inventor: Hartmut Hillmer, Darmstadt, Germany

[73] Assignee: Deutsche Telekom AG, Bonn, Germany

[21] Appl. No.: 520,070

[22] Filed: Aug. 28, 1995

[30] Foreign Application Priority Data

Aug. 31, 1994 [DE] Germany .......................... 44 32 410.3

[51] Int. Cl.$^6$ ...................................................... G02B 6/34
[52] U.S. Cl. ................................................................ 385/37
[58] Field of Search .............................. 385/37, 39, 147, 385/1; 257/609, 615; 372/22, 23, 42, 46, 49, 50, 93, 94, 96

[56] References Cited

U.S. PATENT DOCUMENTS

| | | | |
|---|---|---|---|
| 4,241,109 | 12/1980 | Johnson | 430/321 |
| 4,595,454 | 6/1986 | Dautremont-Smith et al. | 257/622 |
| 4,660,208 | 4/1987 | Johnston, Jr. | 372/46 |
| 4,805,178 | 2/1989 | Wilt | 372/46 |
| 4,815,084 | 3/1989 | Scifres et al. | 372/46 |
| 4,867,515 | 9/1989 | Normandin | 385/1 |
| 4,888,624 | 12/1989 | Johnston, Jr. et al. | 257/609 |
| 4,902,644 | 2/1990 | Wilt | 372/48 |
| 4,941,725 | 7/1990 | Normandin | 385/1 |
| 4,999,315 | 3/1991 | Johnston, Jr. et al. | 437/87 |
| 5,185,754 | 2/1993 | Craig et al. | 372/45 |
| 5,231,642 | 7/1993 | Scifres et al. | 372/45 |
| 5,384,797 | 1/1995 | Welch et al. | 372/50 |

FOREIGN PATENT DOCUMENTS

| | | |
|---|---|---|
| 3643361 | 6/1987 | Germany . |
| 4233500 | 4/1994 | Germany . |

OTHER PUBLICATIONS

Y. Nakano, et al., Analysis, Design, and Fabrication of GaAlAs/GaAs DFB Lasers With Modulated Stripe Width Structure For Complete Single Longitudinal Mode Oscillation, IEEE Journal of Quantum Electronics, vol. 24, No. 10, Oct. 1988, pp. 2017–2033.

H. Soda, et al., Stability in Single Longitudinal Mode Operation in GaInAsP/InP Phase–Adjusted DFB Lasers, IEEE Journal of Quantum Electronics, vol. QE–23, No. 6, Jun. 1987, pp. 804–814.

K. Sato, et al., Simultaneous Operation of 10 Channel Tunable DFB Laser Arrays Using Strained–InGaAsP Multiple Quantum Wells, Conference Digest, 13th IEEE International Semiconductor Laser Conference, Sep. 21–25, 1992, pp. 196–198.

M. Okai et al, Corrugation–Pitch Modulated MQW–DFB Lasers with Narrow Spectral Linewidth, IEEE Journal of Quantum Electronics, vol. 27, No. 6, Jun. 1991, pp. 1767–1772.

G. Chen, et al., Distributed Feedback Lasers with Distributed Phase–shift Structure, Mar. 9, 1992, Appl. Phys. Lett. 60 (21) 25 May 1992, pp. 2586–2588.

B. Broberg, et al., 1.54μm phase–adjusted InGaAsP/InP distributed feedback lasers with mass–transported windows, Apr. 16, 1985, Appl. Phys. Lett 47(1) Jul. 1, 1985, pp. 4–6.

(List continued on next page.)

*Primary Examiner*—Akm E. Ullah
*Attorney, Agent, or Firm*—Kenyon & Kenyon

[57] ABSTRACT

An optoelectronic multi-wavelength component is described for n waveguides with optical feedback gratings arranged side by side laterally to have different characteristic wavelengths. The multi-wavelength component is based on at least two optical waveguides arranged on a substrate so they intersect the grating lines of one or more grating fields at different angles. The grating lines of the feedback grating run at a tilted angle relative to a preferential direction. The angles between each individual waveguide and the grating lines of the respective grating are in the range between 40° and 140°. A controlled change in the effective corrugation period from one waveguide to the next is achieved by means of the individual dimensioning of the tilt angle between the waveguide and the grating lines of the respective feedback grating. The solution is used in photonic components that work on different waveguide channels and are based on DFB or DBR gratings or sampled gratings.

42 Claims, 14 Drawing Sheets

OTHER PUBLICATIONS

K. Kojima et al., Analysis of the Spectral Linewidth of Distributed Feedback Laser Diodes, Journal of Lightwave Technology, vol. LT–3, No. 5, Oct. 1985, pp. 1048–1054.

J. Kinoshita, et al., Performance of 1.5 μm DFB Lasers with a Narrow Stripe Region, IEEE Journal of Quantum Electronics, vol. 27, No. 6, Jun. 1991, pp. 1759–1765.

W. T. Tsang, et al., Control of Lasing Wavelength in Distributed Feedback Lasers by Angling the Active Stripe with Respect to the Grating, IEEE Photonics Technology Letters, vol. 5, No. 9, Sep. 1993, pp. 978–980.

C. Kaden, et al., Fabrication of nonconventional distributed feedback lasers with variable grating periods and phase sifts by electron beam lithography, Jul. 31, 1992, J. Vc. Sci. Technol. B. 10(6), Nov./Dec. 1992, pp. 2970–2972.

H. Yasaka, et al., Optical Frequency Spacing Tunable Four–Channel Integrated 1.55 μm Multielectrode Distributed–Feedback Laser Array, IEEE Photonics Technology Letters, vol. 1, No. 4 Apr. 1989, pp. 75–76.

OPTOELECTRONIC MULTI-WAVELENGTH COMPONENT

FIELD OF THE INVENTION

This invention is used in components that work on various waveguide channels and are based on DFB (distributed feedback) gratings, DBR (distributed Bragg reflector) gratings or sampled gratings with multiple axial interruptions. In the last case, the entire grating consists alternately of areas where there is grating and areas where there is no grating, and where the respective lengths in the axial direction can also be varied. The invention may be used with the following photonic components: lasers, laser amplifiers, filters, couplers, switches, multiplexers, demultiplexers, receivers and detectors. Examples that deserve special mention include laser-amplifier arrays and laser arrays. Laser arrays with monomode emission on various wavelengths are key components for frequency multiplex processes, such as fiber optic communications transmissions.

BACKGROUND OF THE INVENTION

The following articles concerning topics of relevance to the present invention represent the state of the art:
1. Wavelength tuning has been implemented by means of expensive individual current injection into the individual sections of the individual lasers in a semiconductor component with 10 laterally aligned 3-section DFB lasers (K. Sato et al., K-2, 13th IEEE Laser Conference in 1992 in Takamatsu).
2. In an article by H. Yasaka et al., IEEE Photonics Technol. Lett. 1(4) 75 (1989), components that operate simultaneously on four different channels were presented.
3. Abrupt changes in the corrugation period in the longitudinal direction of the component are known from the literature. A greater corrugation period has been achieved holographically in the central section of the laser resonator than in the side sections (M. Okai et al., IEEE J. Quantum Electron. 27, 1767 (1991)).
4. To some extent, electron beam lithography makes it possible to vary the corrugation period of waveguides running side by side laterally. However, the difference between axially adjacent corrugation periods is limited to larger values in this process (C. Kaden et al., J. Vac. Sci. Technol. B 10 (6), 2g70 (1992)). Electron beam lithography is a complicated method and the recording time in electron beam lithography is very expensive.
5. Tilted waveguides running on homogeneous DFB gratings make it possible to vary the corrugation period in the waveguide from that of the original DFB grating. Phase shift (Hirato Shoji; German patent 3,643,361 A1, H 01 S 3/098-C (1987)).
6. The following references which use a section-by-section variation in the thickness or width of the waveguide are listed as representative of the thematic environment with regard to inducing phase shifts in a waveguide:
   A lateral widening or constriction of the waveguide width over a certain length of the longitudinal component direction is used to induce phase shifts (for example, M. Soda et al., IEEE J. Quant. Electron. QE-23,804 (1987), G. Chen et al., Appl. Phys. Lett. 60, 2586 (1992), Y. Nakano et al., IEEE J. Q. Electron. 24, 2017 (1988) or J. Kinoshita et al. IEEE J. Q. Electron. 27, 1759 (1991)).
   A widening of the vertical thickness of the active layer or neighboring waveguide layers over a certain length of the longitudinal component direction is used to induce phase shifts (for example, B. Broberg et al., Appl. Phys. Lett. 47, 4 (1985) or K. Kojima et al., J. Lightwave Technol. LT-3, 1048 (1985)).
7. Tilted waveguides were used in semiconductor laser amplifiers to reduce the end facet reflection (W. I. Way, IEEE Transac. Micr. Techn. 38,534 (1990)).
8. Curved waveguides on homogeneous DFB grating fields can be used for definition of gratings with an axially varied corrugation period (see German Patent Application No. DE 42 33 500).
9. W. T. Tsang et al. IEEE Photon. Technol. Lett. 5,978 (1993) proposed tilted laser waveguides, where the orientation of the gratings runs parallel to the border of the grating. This method permits a defined change in the Bragg wavelength. One disadvantage of the proposed construction is the unfavorable angle range of the angle between the waveguide and the grating lines, which is almost 90°. In order to achieve a minor shift in the Bragg wavelength, a greater change in the angle must be used, but this is not advantageous and leads to fibre coupling problems with the light emitted.

SUMMARY OF THE INVENTION

The object of this invention is to modify the characteristic parameters of the photonic component so that they are optimized to the desired purpose. The optoelectronic component according to this invention should make it possible for n waveguides with optical feedback gratings arranged side by side laterally at right angles to the light propagation direction to have different characteristic wavelengths.

The optoelectronic multi-wavelength component is based on several optical waveguides arranged on a substrate so they intersect the grating lines of one or more grating fields at different angles or with any desired curvature. In the case of curved waveguides, different local angles occur between the grating and the waveguide. The grating lines of the feedback grating also run at an angle with respect to a preferred direction. The angles between each individual waveguide and the grating lines of the respective gratings run in an angle range of 40° to 140°. The case of uncurved waveguides is discussed first below and then the discussion is generalized to individually curved waveguides.

The desired parameters for the optoelectronic multi-wavelength component are achieved through a suitable choice of the number of optical waveguides, where there are at least two optical waveguides with different tilt angles, and through a suitable choice of the lateral distance between the optical waveguides, the individual waveguide widths, the corrugation period of the grating field, the tilt angle, the axial position and the number of phase shifts that are integrated into the grating field or the waveguides, as well as the lengths of the areas where there are gratings and the areas where there are no gratings in the direction of propagation of light.

The present invention makes it possible to produce waveguides with optical feedback gratings arranged side by side at right angles to the direction of light propagation so they are characterized by different effective corrugation periods. The optoelectronic component is based on several optical waveguides that intersect the grating lines of one or more grating fields at different angles. The grating lines of the feedback grating that are provided in the optoelectronic component are tilted with respect to a preferential direction. The angles between each individual waveguide and the grating lines of the respective gratings are in the range between 40° and 140°. At least two optical waveguides with different tilt angles to the grating lines of the feedback grating(s) are provided on the component, where the effective corrugation period is effectively varied from one waveguide to the next by means of the individual dimensions of the tilt angle between each waveguide and the grating lines of its respective feedback grating. The tilt angles required for the desired wavelength $\lambda_{B,i}$ are specified for a first-order grating according to the equation:

$$\zeta_i = \arccos((\Lambda_0 \cdot 2 \cdot n_{eff,i})/(\lambda_{B,i})).$$

BRIEF DESCRIPTION OF THE DRAWINGS

The solution according to this invention will now be explained in greater detail with reference to several practical embodiments, in which.

DETAILED DESCRIPTION

Figure 1:
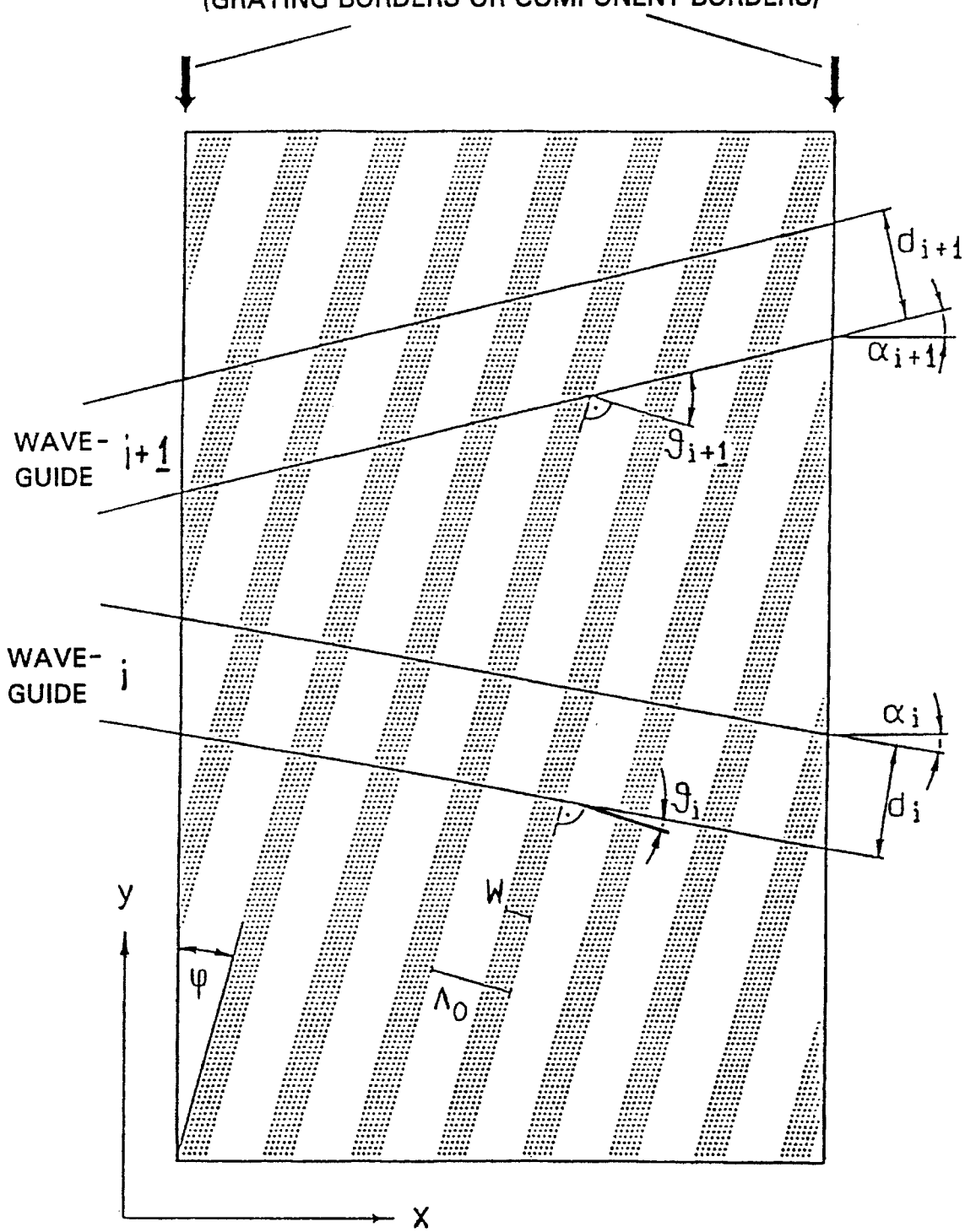
FIG. 1 shows a diagram of a detail of the optical feedback grating in the xy plane.

FIG. 1 shows a diagram of a detail of the optical feedback grating in the xy plane, containing two tilted optical waveguides running vertically (normal to the xy plane) above or below or inside the homogeneous grating field. Thus, the optoelectronic component can operate simultaneously on two different frequency channels. The wavelength intervals of the individual waveguides relative to each other can be controlled and adjusted with an extremely high precision by tilting the waveguides with respect to the grating lines. $\Lambda_0$ is the corrugation period of the grating, W is the grating web width and $W/\Lambda_0$ is the duty cycle. Furthermore, $\zeta_i$ is the angle between the normal to a grating line and the direction of the optical waveguide i. The angle $\alpha_i$ describes the angle of entrance or exit of the waveguide i. The width of the waveguide may be varied (here $d_i$ and $d_{i+1}$), which affects the effective refractive index $n_{eff,i}$. The left and right grating borders shown here stand for directions drawn on the basis of crystallography or component geometry (preferential directions). The preferential directions may be cleaved or etched grating borders, cleaved or etched component borders, cleaved semiconductor wafer borders or etched borders on the semiconductor wafer. The right and left grating borders either correspond exactly to this preferential direction or they run at a controlled angle to it. The effective corrugation period can be adjusted on the basis of the tilt angle $\zeta_i$ as follows:

$$\Lambda(\zeta_i) = \Lambda_0/\cos(\zeta_i).$$

The characteristic Bragg wavelength of an individual waveguide i is then given by:

$$\Lambda_{B,i}(\zeta_i) = 2\, n_{eff,i} \Lambda_i(\zeta_i).$$

Gradations in the effective corrugation period from one waveguide to the next is achieved by means of optical waveguides with different tilts that are in the range of optical feedback gratings. The gratings may include either no phase shifts or a certain number k of phase shifts $\Delta\phi_1$ ($1 \leq 1 \leq k$). In FIG. 1, k=0, but in FIGS. 2 and 4, k=1. The effective corrugation period that can be varied in the direction of propagation of the light is the result of the controlled individual tilting of the optical waveguides relative to the grating lines—in other words, the optical waveguides do not intersect the grating lines at the same angle for each waveguide i. As a result of controlled tilting of the waveguide i, grating webs $W_i$ or grating grooves ($\Lambda_i - W_i$) that are stretched by a factor of $1/\cos(\zeta_i)$ in comparison with their original length occur, depending on the tilt angle $\zeta_i$.

For the purpose of illustration, however, the relative component element sizes, the angles, the widths of the waveguides and the corrugation periods are not drawn true to scale in the figures. Typically $d_i \gg \Lambda_0$. Only very moderate tilt angles are required in order to produce typical changes in the effective corrugation periods between neighboring waveguides. The diagrams in the figures exaggerate the tilt for the purpose of illustration.

The entire grating field may be, for example, produced holographically (optical lithography with UV or X-ray light), defined with electron beam lithography or implemented with ion beam lithography. The grating may also be a DBR type or a sampled grating, where there are a certain number of areas with no grating in the direction of propagation of light. The grating may result in pure, real index coupling, pure, imaginary index coupling or complex coupling (real and imaginary coupling). The coupling may include pure or refractive index coupling and loss or gain coupling. The cross-sectional shape of the grating may be triangular, rectangular or sinusoidal, for example. Furthermore, mixed shapes are also possible, such as a rectangular shape with rounded corners.

Figure 2:
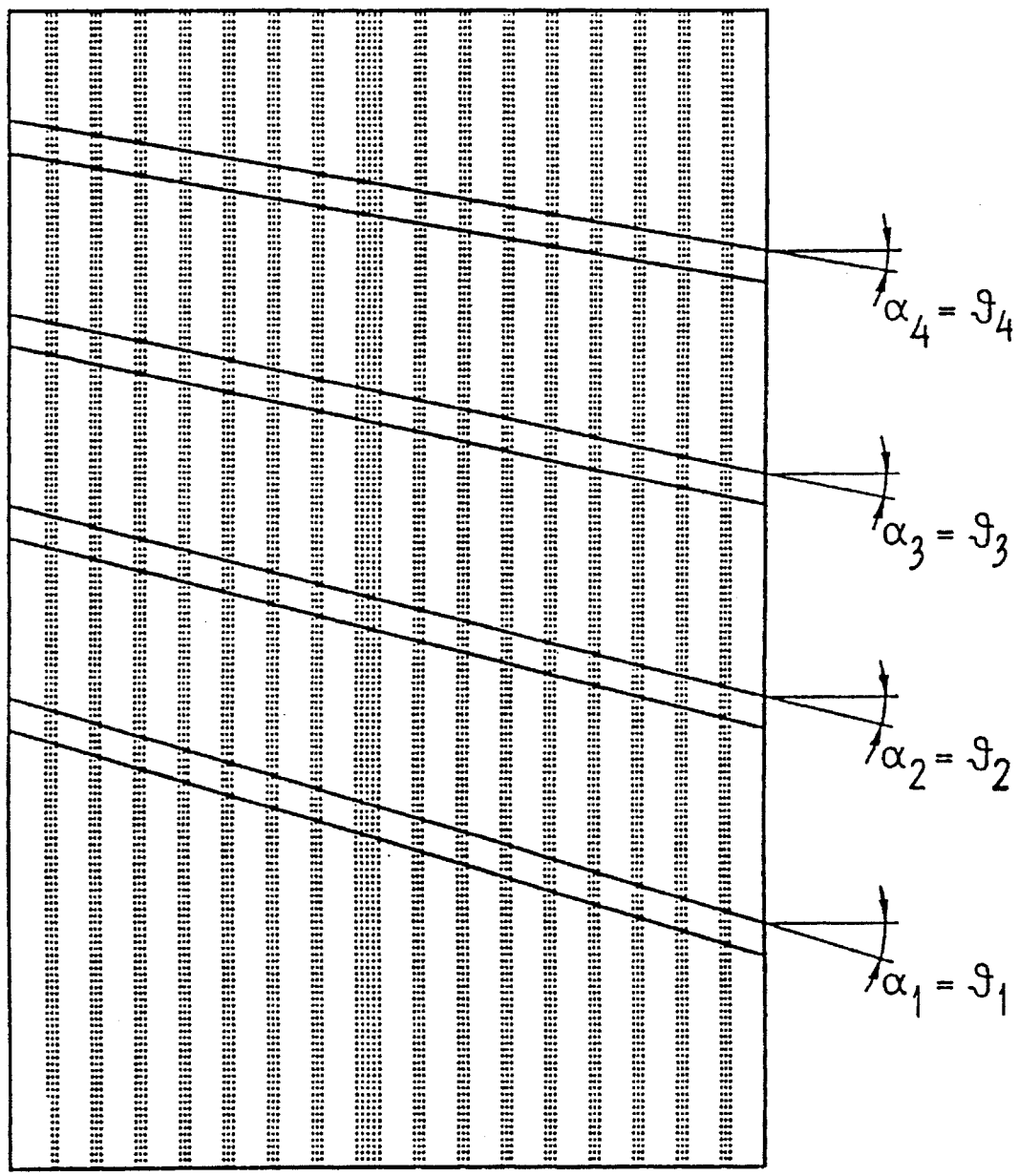
FIG. 2 shows a top view of a DFB grating with an abrupt phase shift (locally broadened grating web).

FIG. 2 shows a top view of a DFB grating with an abrupt phase shift (locally broadened grating web). In this example, the grating webs run parallel to the left edge of the grating field which may be a preferred crystallographic or component geometric direction. In this example, the entrance and exit angle $\alpha_i$ of the waveguide i is identical to the angle $\zeta_i$ formed by a line normal to a grating line and the waveguide. The phase shift in this example is produced in the grating and is identical in all four waveguides shown here. That means that the phase shift which is created by the grating is also the same for various waveguide tilts. For the purpose of illustration, $\Lambda_0$ and $d_i$ were selected to be of the same order of magnitude. Typically, however, $d_i \gg \Lambda_0$.

Figure 3:
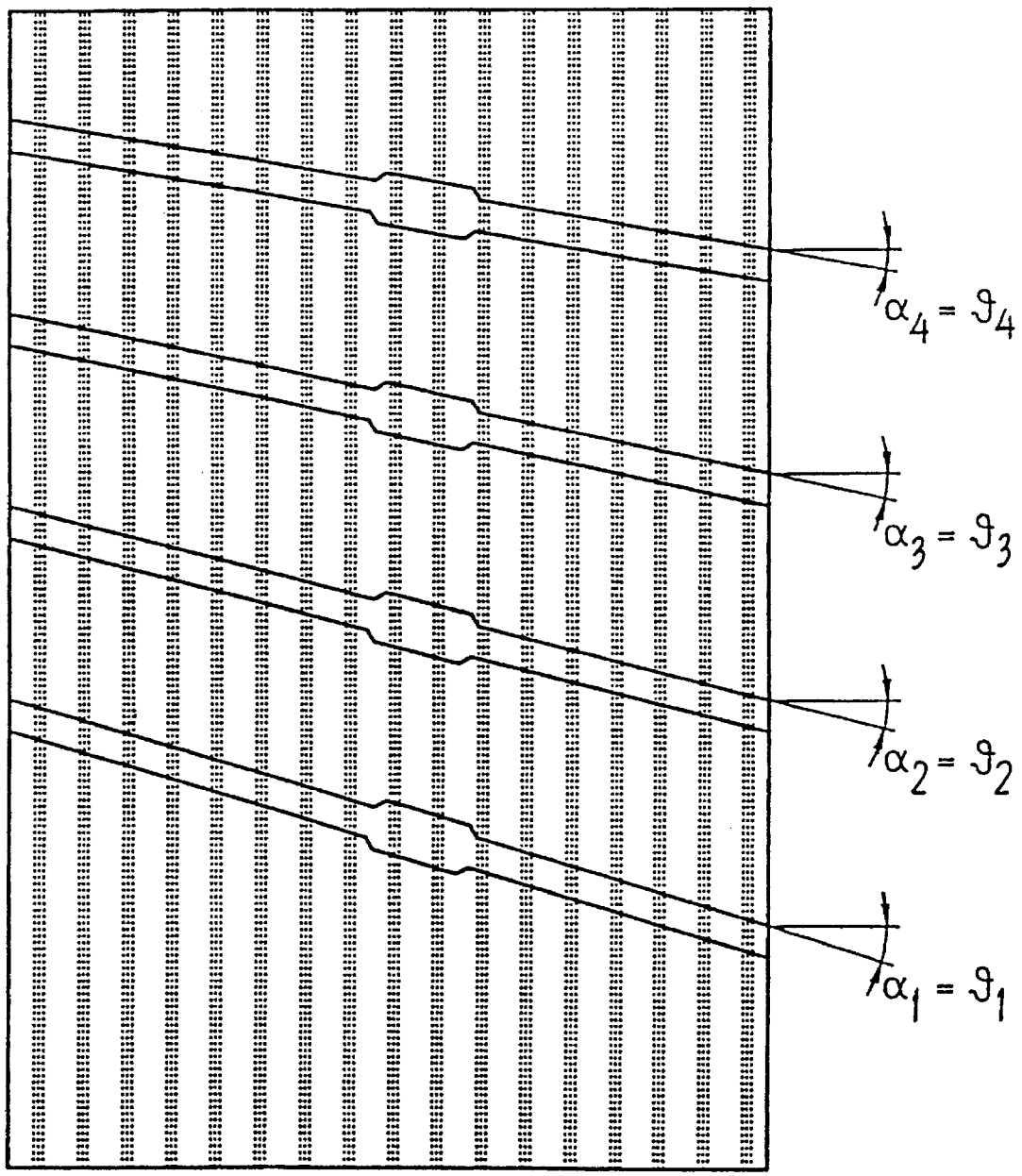
FIG. 3 shows a DFB grating field without a phase shift, with an angle and waveguide configuration corresponding to that in FIG. 2.

FIG. 3 shows a DFB grating field without a phase shift, with an angle and waveguide configuration corresponding to that in FIG. 2. In this case, the phase shift in the waveguides is achieved by means of a waveguide width that is enlarged over a defined part of the length of the waveguide (local sectional broadening of the waveguide). The amount of the phase shift is the same in all four waveguides illustrated here and does not depend on the amount of waveguide tilting.

Figure 4:
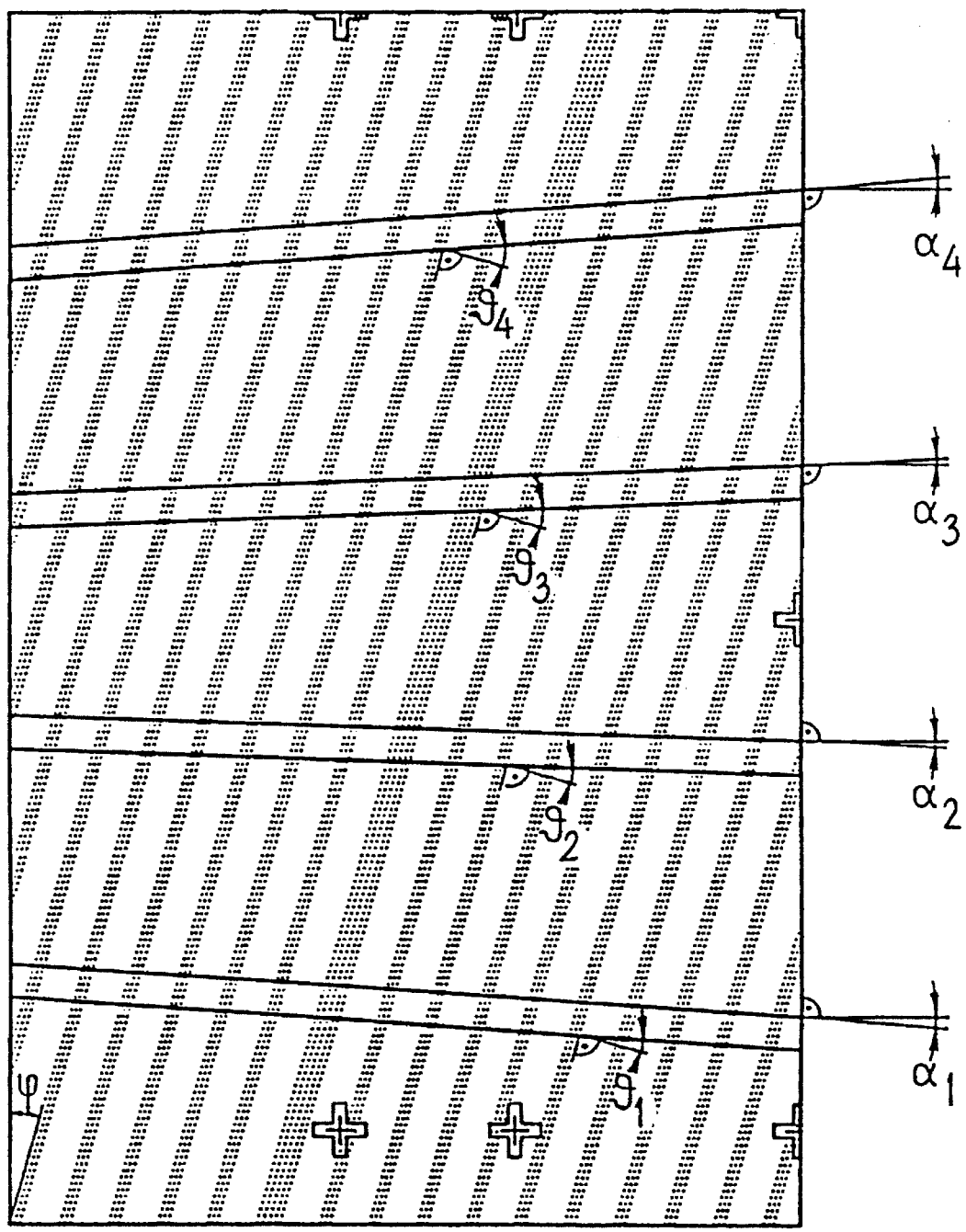
FIG. 4 shows a phase-shifted DFB grating field that is tilted by the angle $\phi$ in comparison with the left border of the grating.
Figure 7:
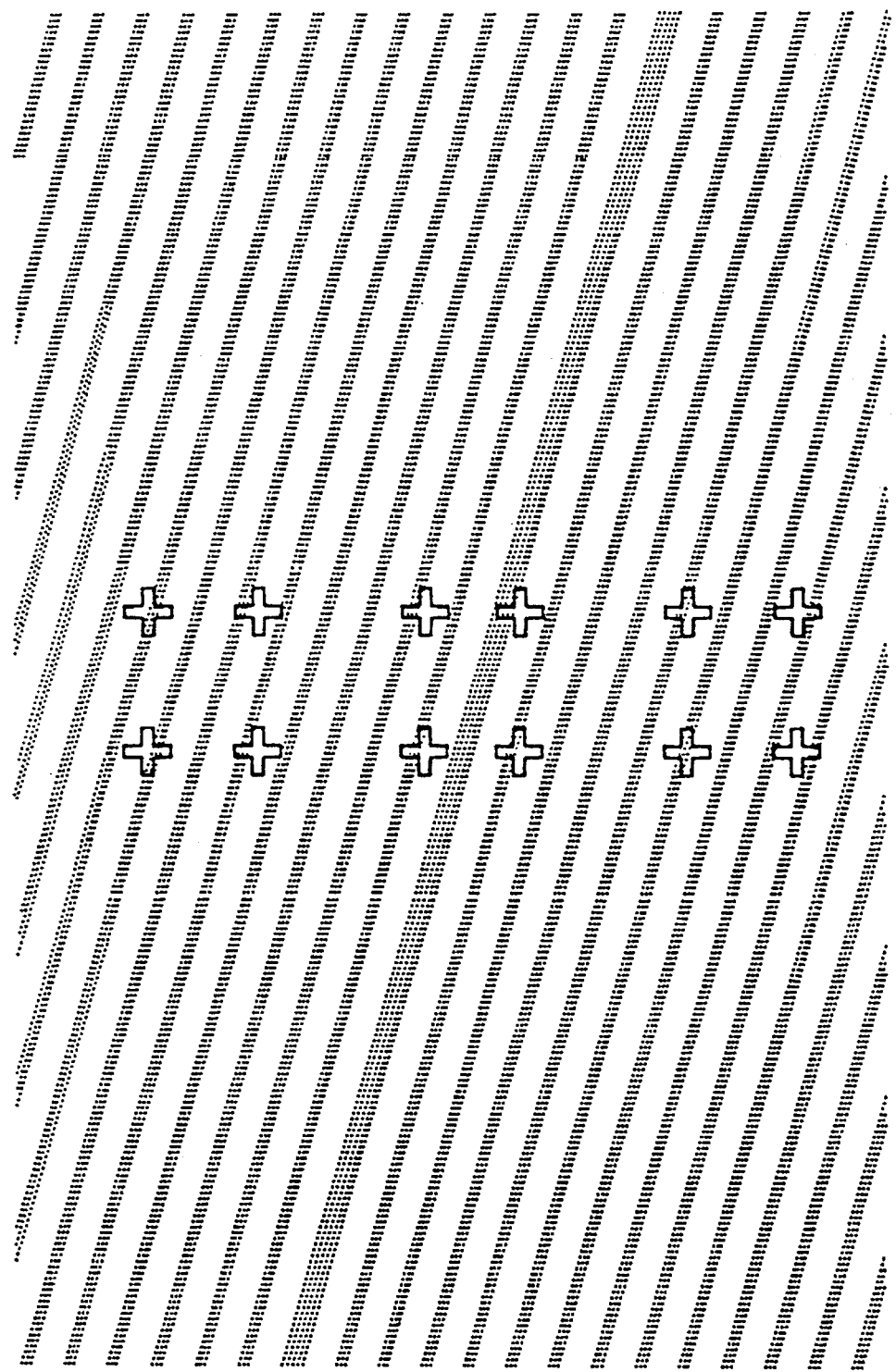
FIG. 7 shows an example of a DFB grating produced by electron beam lithography together with alignment marks.
Figure 8:
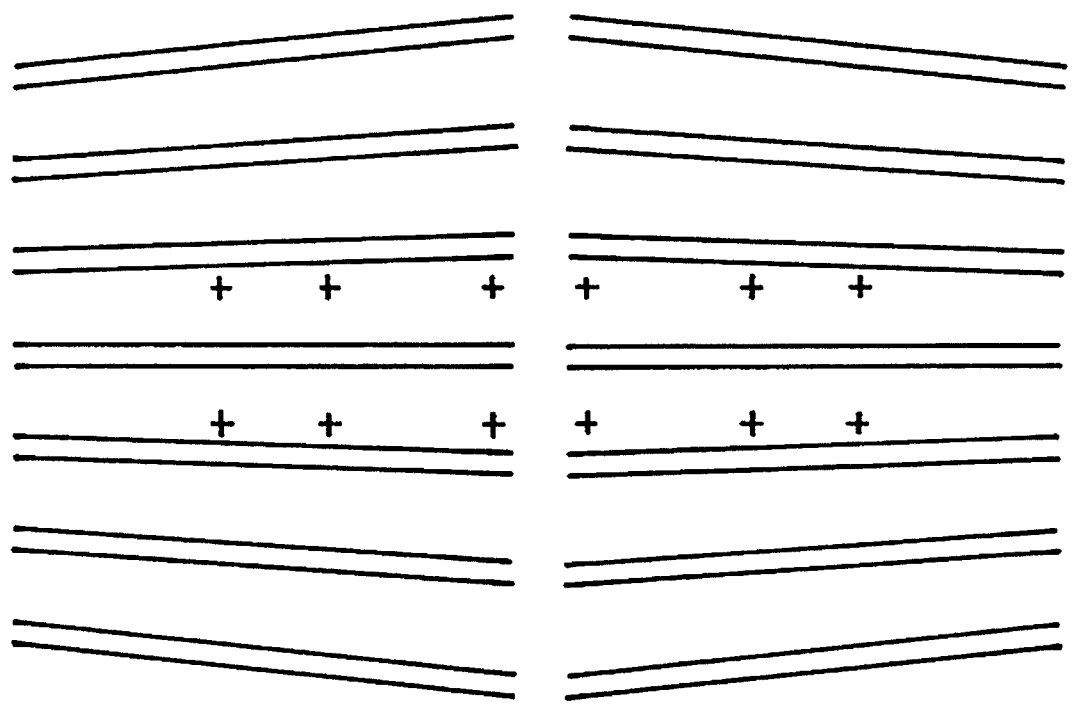
FIG. 8 illustrates marks corresponding to the embodiment shown in FIG. 7.

FIG. 4 shows a phase-shifted DFB grating field that is tilted by the angle $\phi$ in comparison with the left border of the grating. The relevance of the cross-hairs is illustrated in FIGS. 7 and 8 by an example. One advantage of this symmetrical arrangement ($\alpha_1=-\alpha_4$ and $\alpha_2=-\alpha_3$) is the smaller difference in angles in the tilt of adjacent waveguides when, for example, a certain wavelength interval is specified from one waveguide to the next. Another advantage of the arrangement illustrated in FIG. 4 ($\phi>0$) in comparison with the examples illustrated in FIGS. 2 and 3 is that the angles $\alpha_i$ can be much smaller when a certain wavelength shift is specified from one waveguide to the next. One possible disadvantage of this example is the local shift in location of the phase shift in the x direction from one waveguide to the next.

Figure 5:
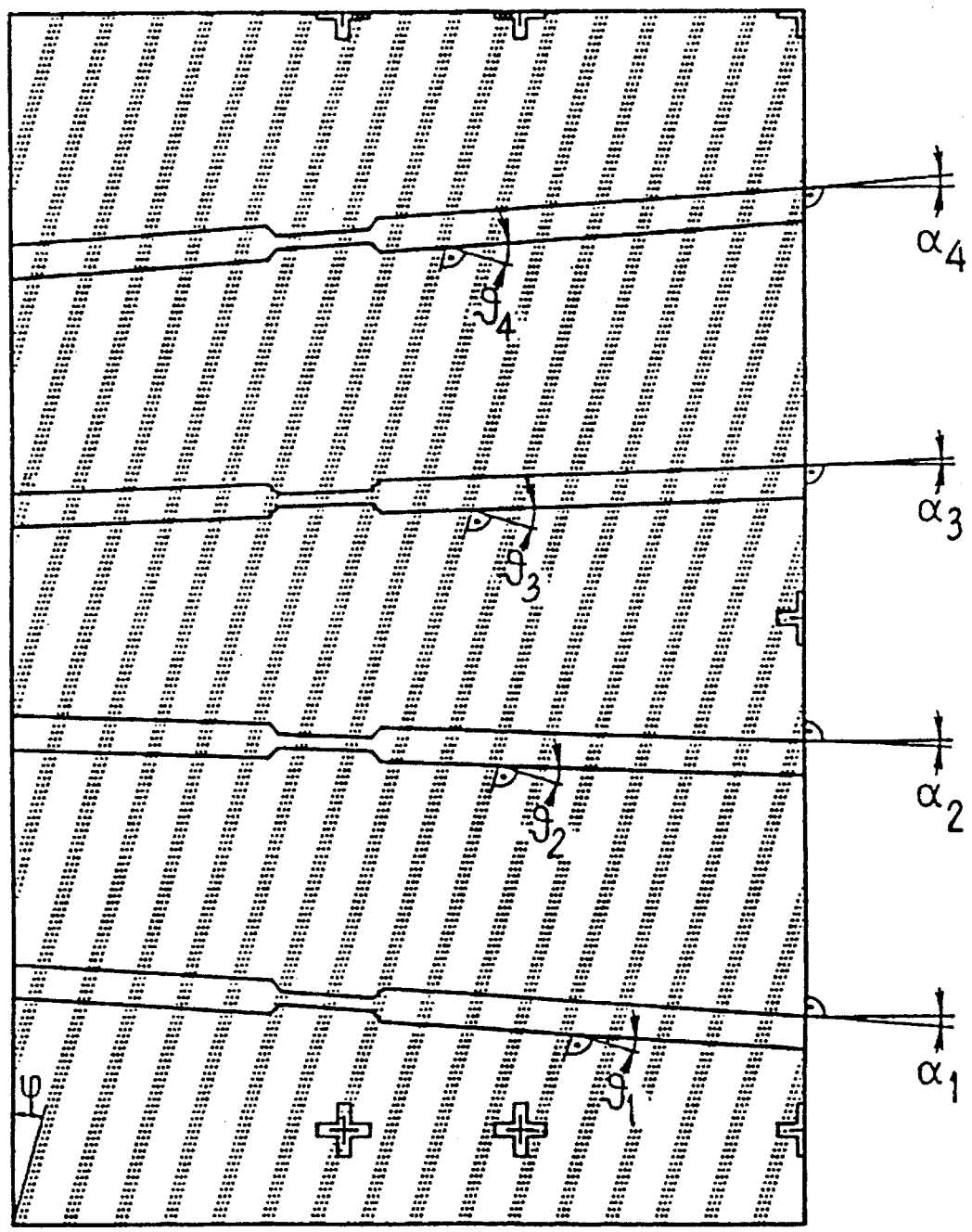
FIG. 5 shows a DFB grating that does not have a phase shift and is tilted by the angle $\phi$ relative to the left border of the grating.

FIG. 5 shows a DFB grating that does not have a phase shift and is tilted by the angle $\phi$ relative to the left border of the grating. The angle and waveguide configuration shown here corresponds to the waveguide configuration shown in FIG. 4. Since the phase shift in all four waveguides shown is achieved by means of a reduced waveguide width over a defined part of the length of the waveguide (local sectional narrowing of the waveguide), the location of the phase shift can be fixed precisely in the x direction. The disadvantage associated with the embodiment illustrated in FIG. 4 can be avoided as shown in FIG. 5.

Figure 6:
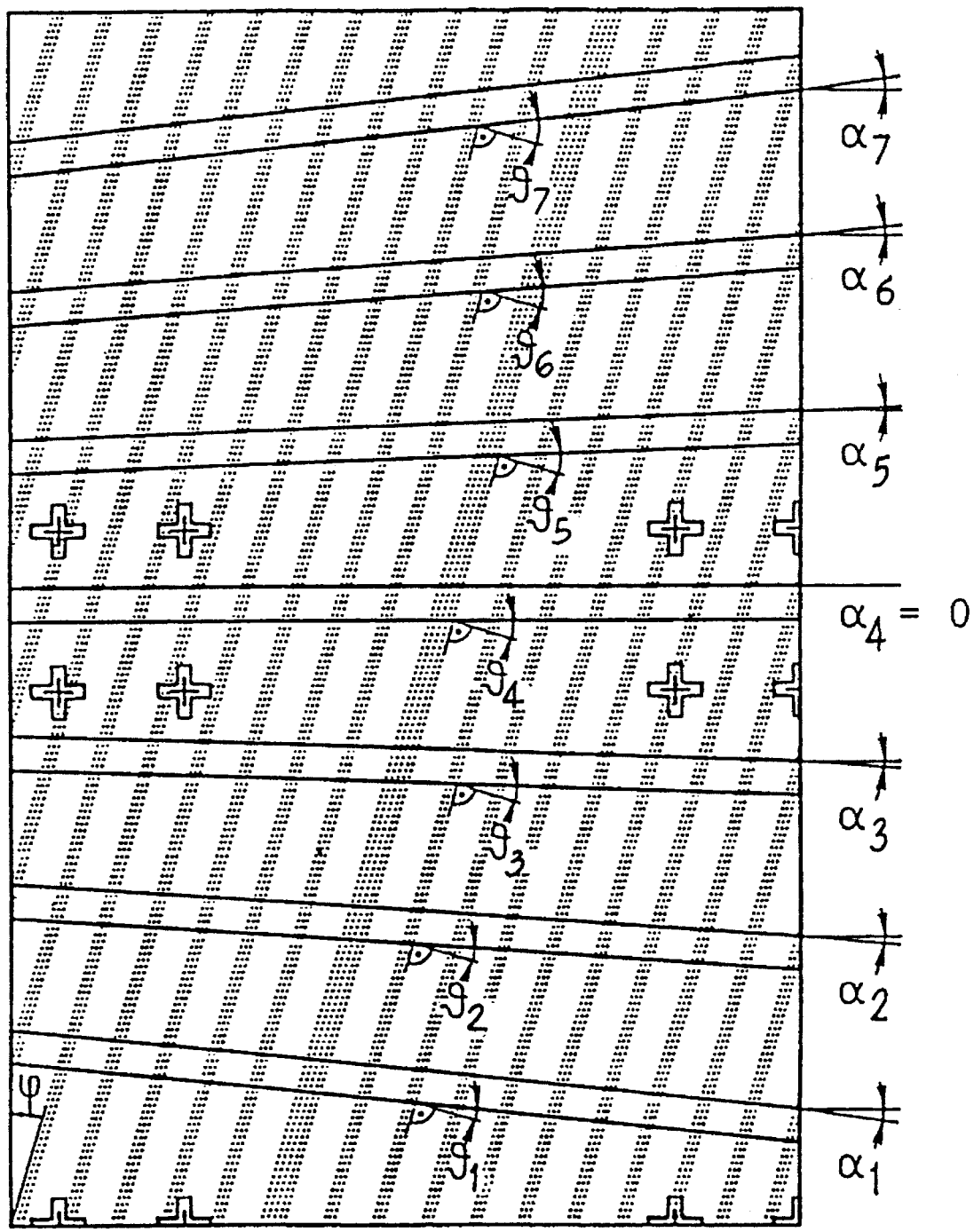
FIG. 6 shows a DFB grating field that has a phase shift and is tilted by the angle $\phi$ with respect to the left border of the grating.

FIG. 6 shows a DFB grating field that has a phase shift and is tilted by the angle $\phi$ with respect to the left border of the grating. Here again, one advantage of this symmetrical arrangement ($\alpha_1=-\alpha_7$, $\alpha_2=\alpha_6$ and $\alpha_3=-\alpha_5$) is the extremely small difference in angles of tilt of neighboring waveguides. One special feature of this example is that the middle waveguide runs at right angles to the right and left borders of the grating, in other words, $\alpha_4=0$. The adjusting marks (cross-hairs) that are included in FIGS. 4–6 are provided for fixing the angles $\alpha_i$, $\zeta_i$ and $\phi$. An example of using the adjusting marks is given in the next two figures, FIGS. 7 and 8. The adjusting marks may be omitted when working with an identical, exactly verifiable reference of all process steps to a preferential direction of the component.

FIG. 7 shows an example of a DFB grating produced by electron beam lithography, including the defined adjusting marks aligned relative to a defined preferential direction, as shown in the examples of FIGS. 4–6. This procedure defines the angle $\phi$. For example, a mask that contains suitable complementary adjusting marks that fix the angles $\alpha_i$ and $\zeta_i$ with a correct adjustment of the corresponding marks as illustrated in FIG. 8 may be used for the definition of the waveguide. When FIGS. 7 and 8 are superimposed and the marks are adjusted accordingly, the result is an arrangement similar to that shown in FIG. 6. However, it is not essential to use adjusting marks for the definition of $\phi$. In the holographic definition of the grating, the angle $\phi$ can also be adjusted directly by accurate rotation of the semiconductor wafer before exposure. However, the use of adjusting marks is advisable for the following waveguide definition, for example, by means of photoresist masks. These adjusting marks are then aligned with regard to a preferred crystallographic direction or component geometry.

Figure 9:
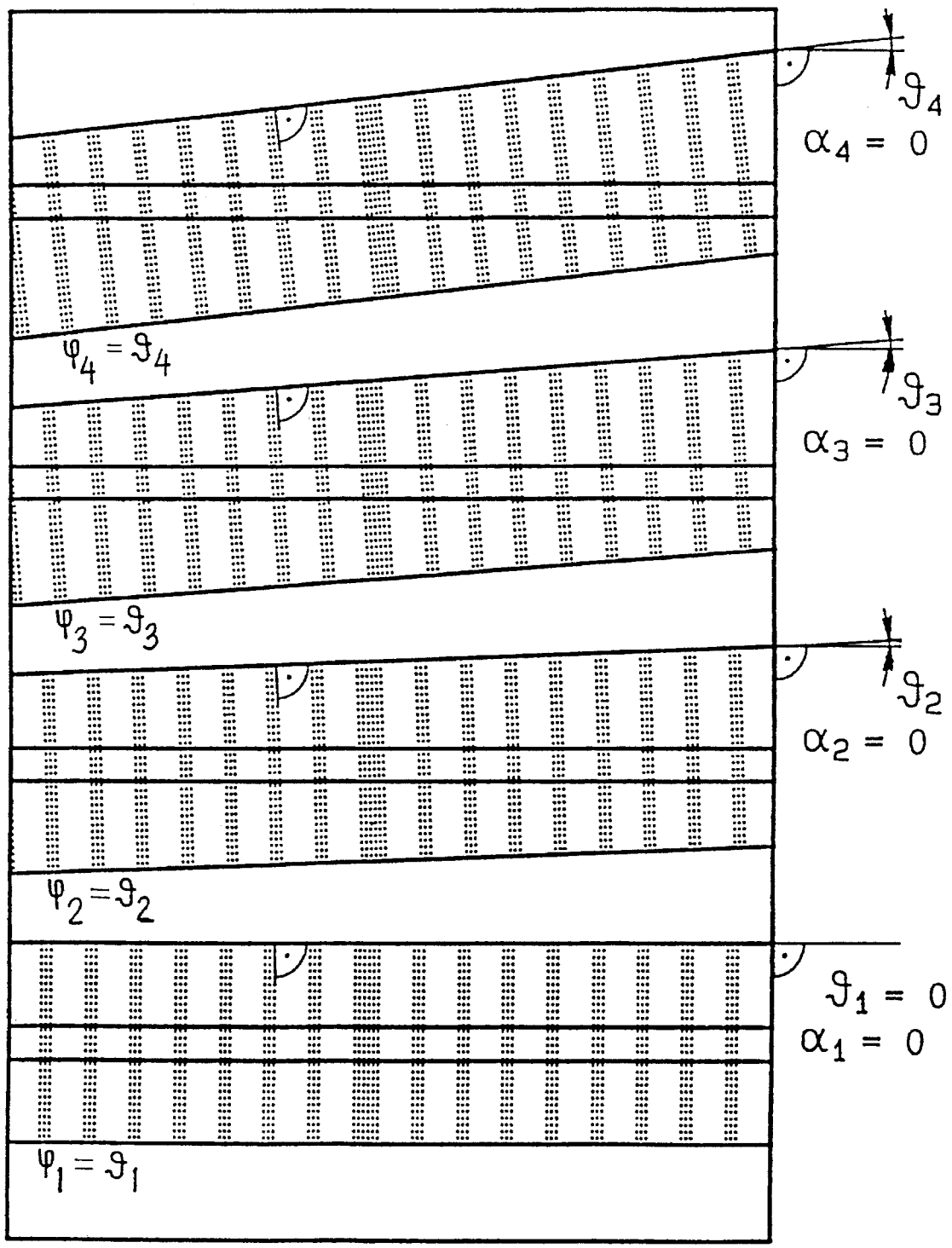
FIG. 9 shows a detail of a component with 4 waveguides.

FIG. 9 shows a detail of a component with 4 waveguides. The advantage of this solution is that all the angles $\alpha_i=0$, in other words, all the waveguides intersect the right and left borders of the grating (for example, the two resonator end faces in the case of a DFB semiconductor laser) at right angles. However, this embodiment is not based on a uniform grating field, but instead when there are i waveguides, a maximum of i individual grating fields, all of which can be tilted differently in regard to the respective waveguides i. Another advantage of this solution is that the phase shift integrated into the grating can be accommodated at the same location in the x direction in the waveguide. Again in this example, the individual grating fields can be created by the inexpensive holographic method. Each grating field i may be defined in stripes, as shown in FIG. 9, but first the angle $\phi_i$ is adjusted directly by accurately rotating the semiconductor wafer.

The grating lines may be created on a semiconductor surface holographically, by electron beam lithography or ion beam lithography, and in each case the semiconductor wafer can be rotated to alter the waveguide tilt angle $\zeta_i$. The waveguide structures can be developed through a photoresist layer on the semi-conductor surface by ion beam lithography, electron beam lithography, or optical mask lithography. The waveguide structures can also be defined on the semiconductor surface by ion beam lithography or implantation and subsequent regulated heating.

Figure 10:
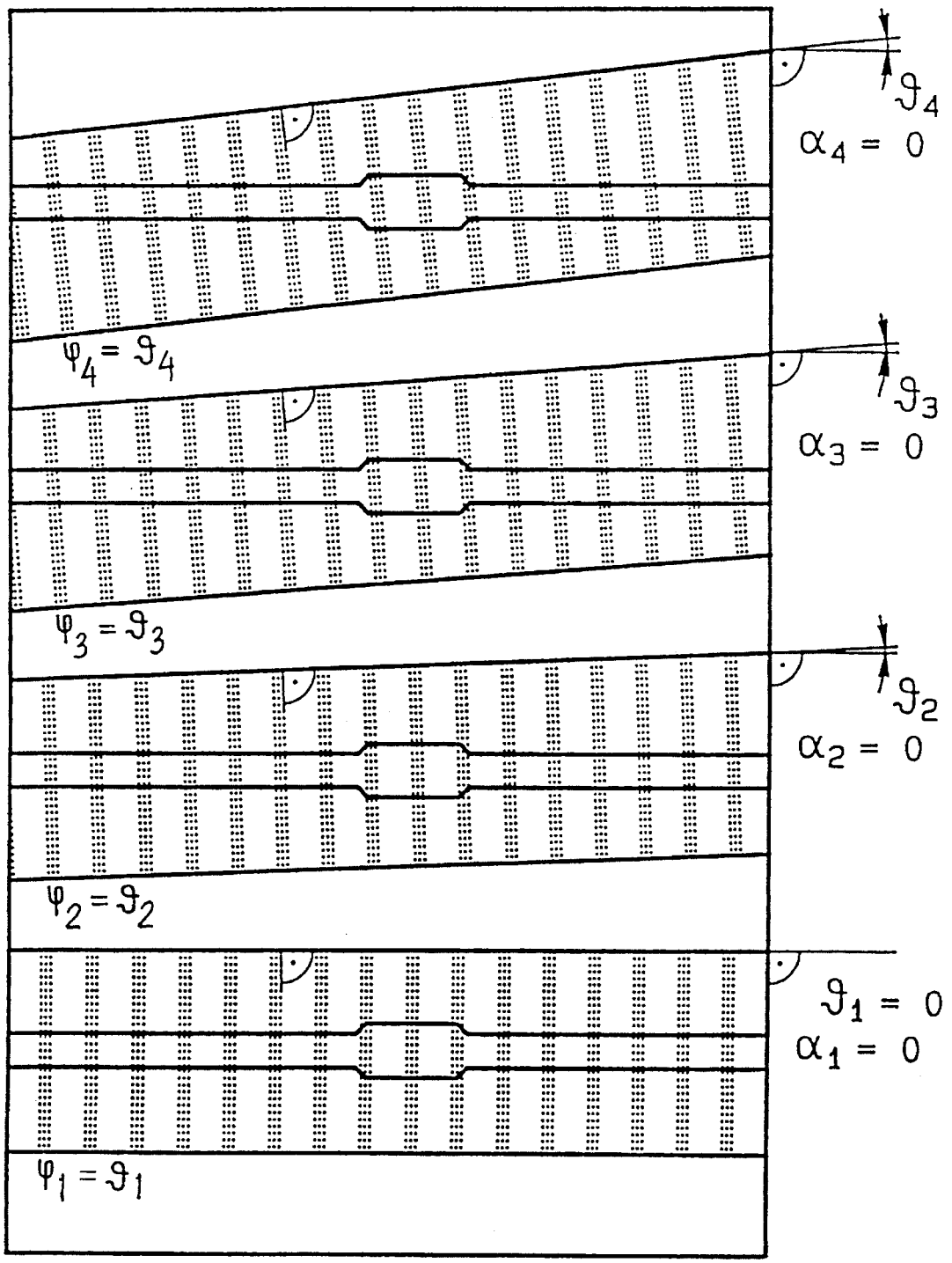
FIG. 10 shows the embodiment that corresponds to FIG. 9, where the phase shift in each waveguide is defined by a local sectional increase in width of the waveguide.

FIG. 10 shows the embodiment that corresponds to FIG. 9, where the phase shift in each waveguide is defined by a local sectional increase in width of the waveguide.

Figure 11:
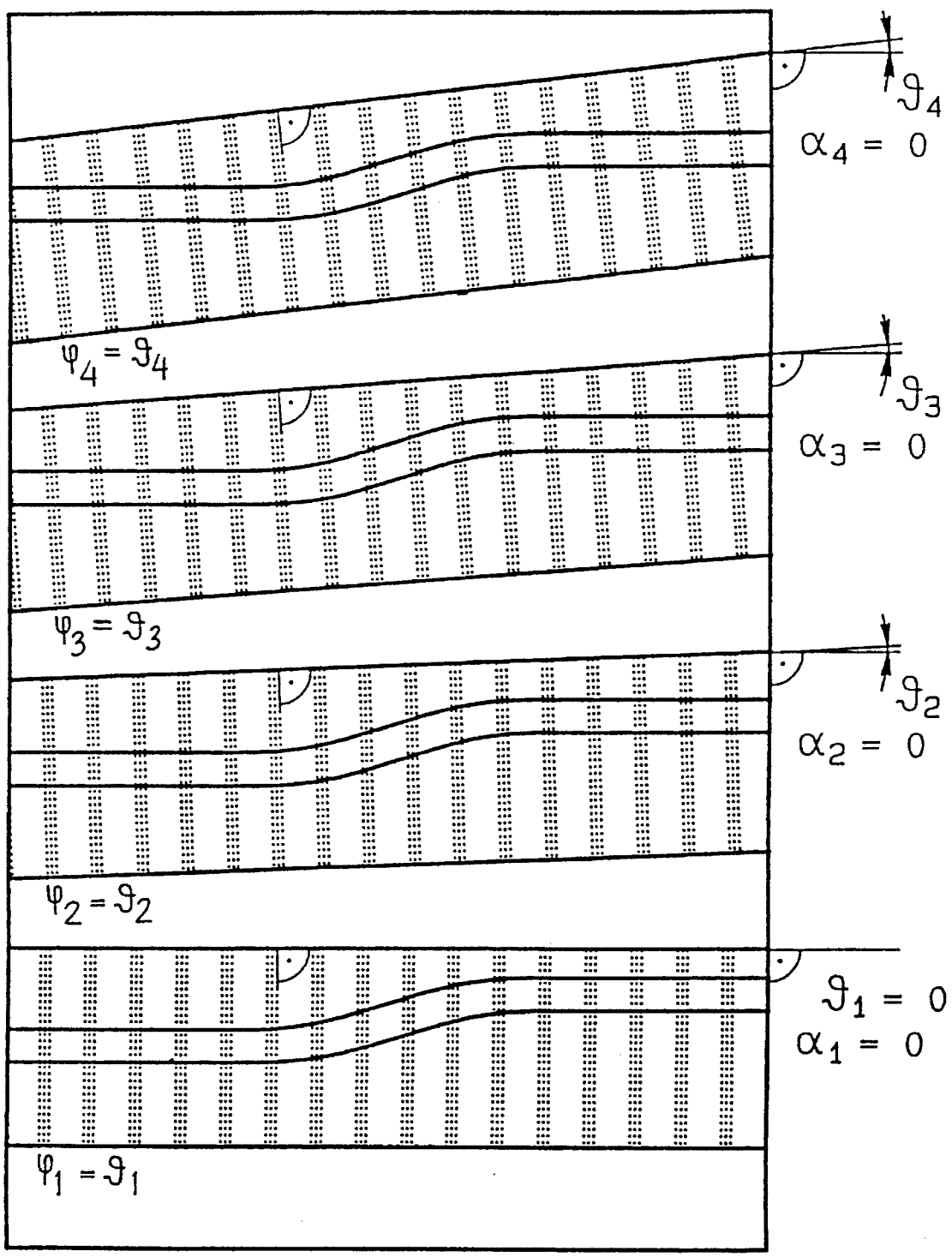
FIG. 11 shows an embodiment that corresponds to FIGS. 9 and 10, where the phase shift in each waveguide is defined by a sectional curvature of the waveguide.

FIG. 11 shows an embodiment that corresponds to FIGS. 9 and 10, where the phase shift in each waveguide is defined by a sectional curvature of the waveguide. This embodiment allows an efficient spatial distribution of the phase shift. The solutions illustrated in FIGS. 9–11 guarantee equal lengths of all the waveguides when the right and left borders of the grating are parallel to each other, as by crystallographic cleaving.

Figure 12:
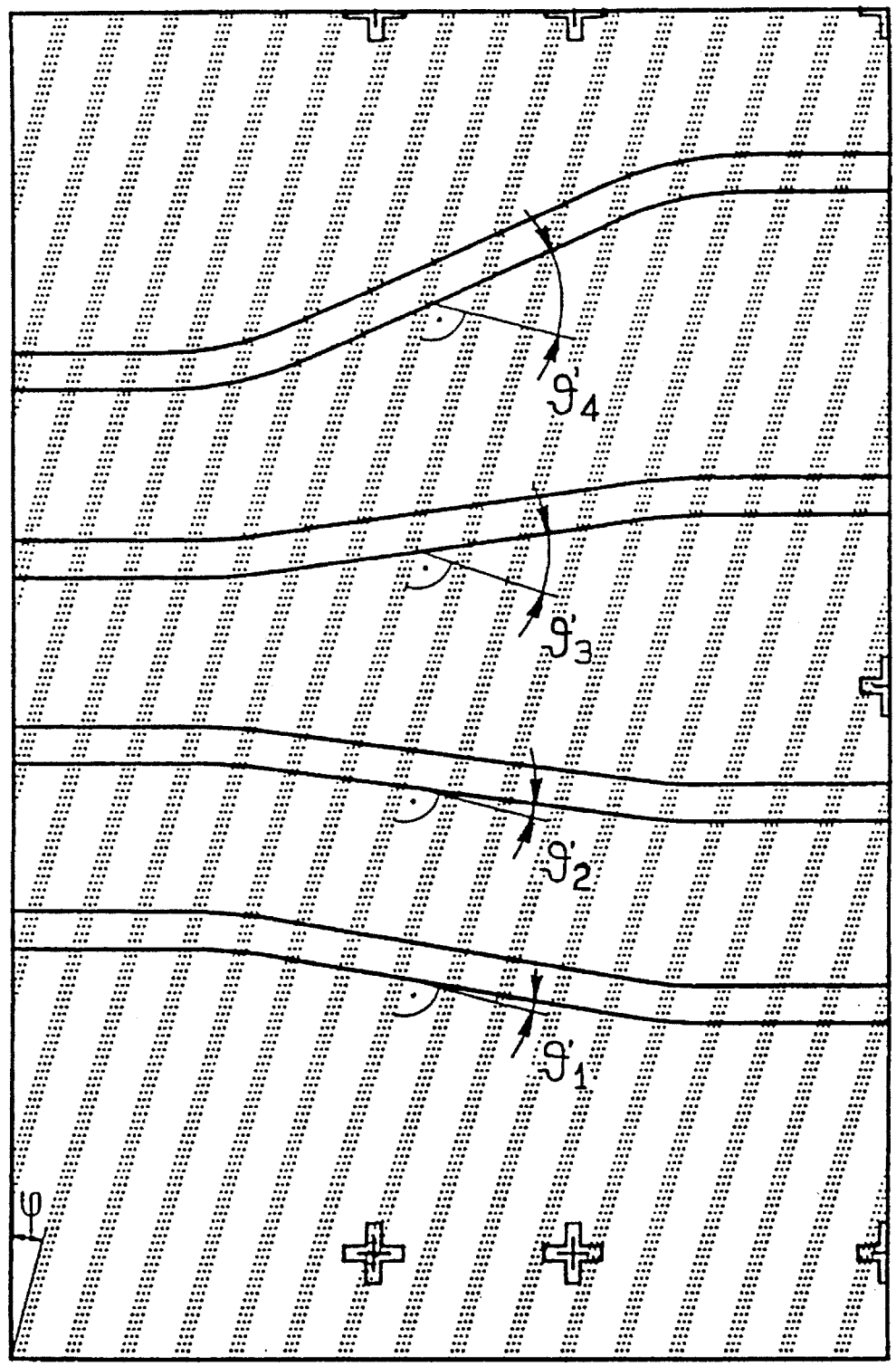
FIG. 12 shows a DFB grating that does not have a phase shift and is tilted by the angle $\phi$ with respect to the left border of the grating.

FIG. 12 shows a DFB grating that does not have a phase shift and is tilted by the angle $\phi$ with respect to the left border of the grating. The phase shift in each waveguide is achieved by an individual curvature of the waveguide. In the example shown here, each waveguide is composed of three straight and two curved segments.

Figure 13:
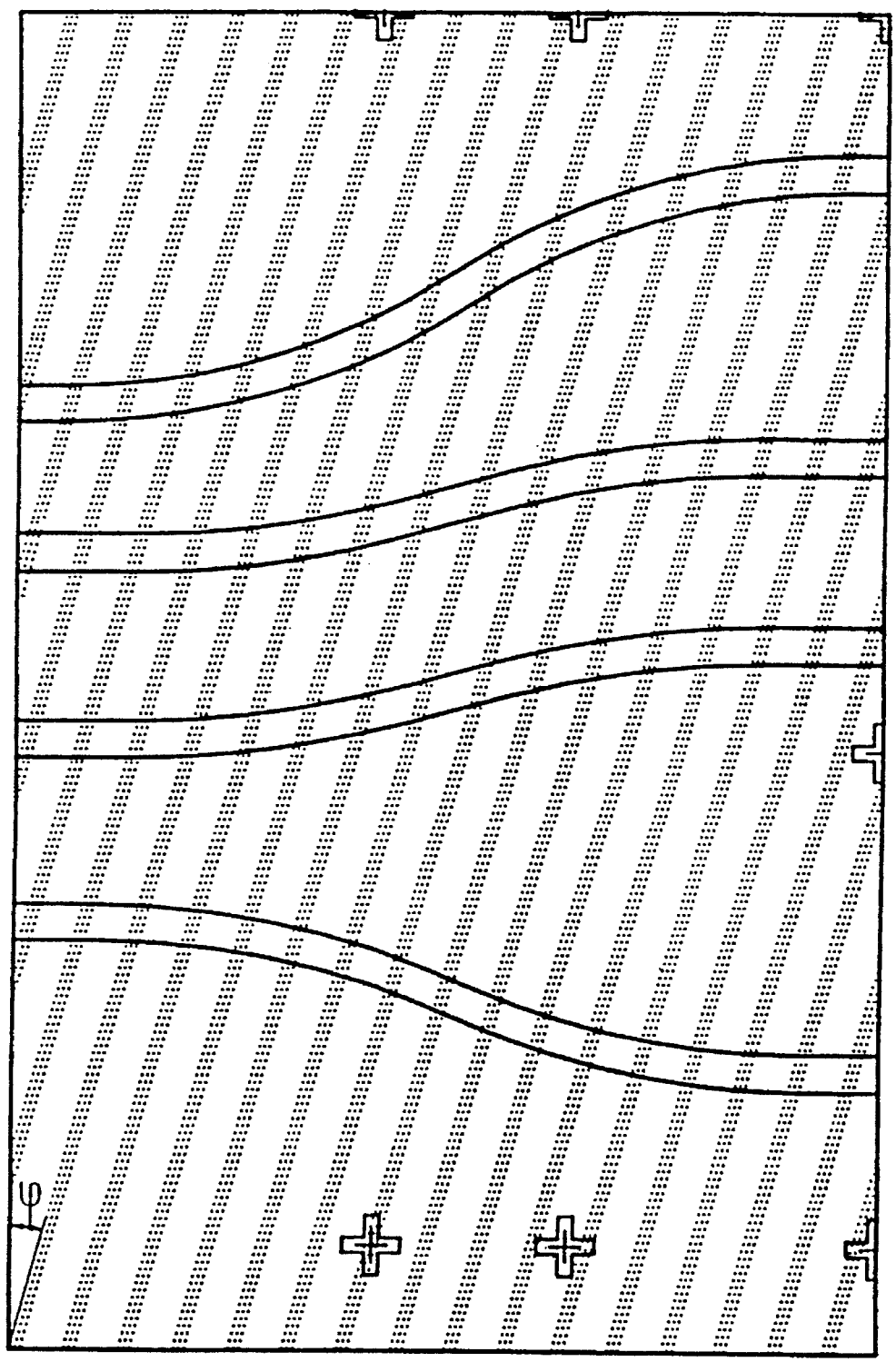
FIG. 13 shows a DFB grating that does not have a phase shift and is tilted by the angle $\phi$ with respect to the left border of the grating.

FIG. 13 shows a DFB grating that does not have a phase shift and is tilted by the angle $\phi$ with respect to the left border of the grating. The phase shift is achieved in each waveguide by an individual waveguide form and is distributed over the entire length of the grating.

Figure 14:
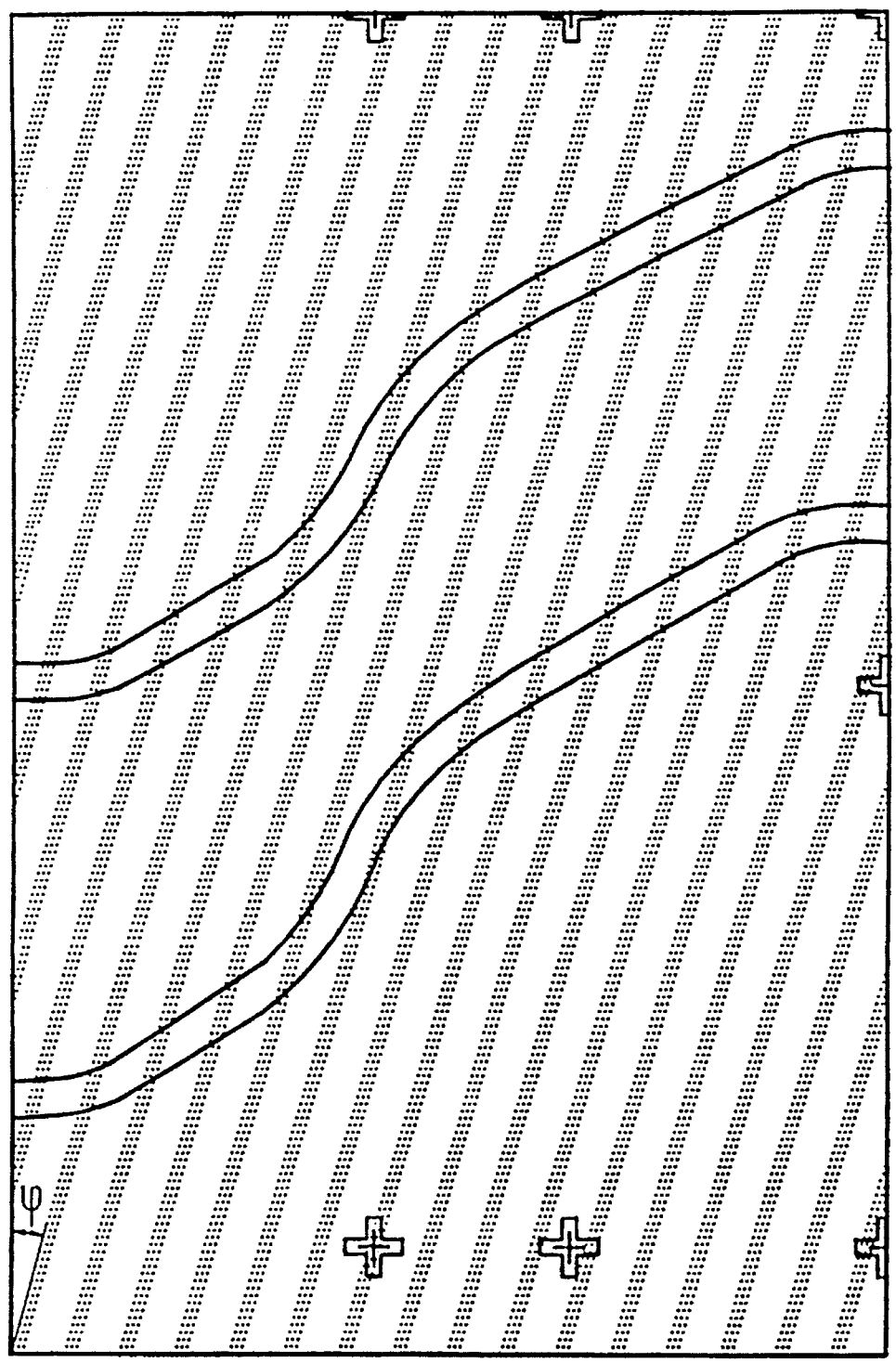
FIG. 14 shows a DFB grating that does not have a phase shift and is tilted by the angle $\phi$ with respect to the left border of the grating.

FIG. 14 shows a DFB grating that does not have a phase shift and is tilted by the angle $\phi$ with respect to the left border of the grating. The phase shift is implemented in each waveguide by an individual curvature of the waveguide. In the example shown here, each waveguide is composed of three straight sections and four curved sections.

In order to produce a wavelength difference in the range of a few nanometers, the differential angles ($\zeta_i - \zeta_{i+1} = \Delta\zeta_{i,i+1}$) are typically on the order of 1° with an optimized design and $\phi$ not equal to 0. Since very small angles are sufficient for producing small wavelength differences between neighboring waveguides, the resulting angles $\zeta_i$ and $\alpha_i$ are typically between 0° and 20°. The embodiment according to this invention will now be explained in greater detail on the basis of some sample calculations, where $\Delta\zeta_{i,i+1}$ or $\Delta\alpha_{i,i+1}$ is the angle difference between neighboring waveguides.

For the sample calculations, the same waveguide width and the same effective refractive index $n_{eff}=3.2700422$ are assumed for all waveguides. A certain wavelength difference $\Delta\lambda$ between neighboring waveguides is the aim.

| 1. Sample calculation: $\Delta\lambda = 1$ nm, $\Lambda_0 = 237$ nm, $\theta_1 = 0°$ | | | |
|---|---|---|---|
| $\lambda_1 = 1.550$ μm | $\Lambda_1 = 237.000$ nm | $\theta_1 = 0.00000°$ | |
| | | | $\Delta\theta_{12} = 2.060°$ |
| $\lambda_2 = 1.551$ μm | $\Lambda_2 = 237.153$ nm | $\theta_2 = 2.05755°$ | |
| | | | $\Delta\theta_{23} = 0.815°$ |
| $\lambda_3 = 1.552$ μm | $\Lambda_3 = 237.306$ nm | $\theta_3 = 2.90900°$ | |
| | | | $\Delta\theta_{34} = 0.653°$ |
| $\lambda_4 = 1.553$ μm | $\Lambda_4 = 237.459$ nm | $\theta_4 = 3.56190°$ | |

The angles $\alpha_i$ and $\zeta_i$ here are equal. Furthermore, $\Delta\zeta_{1,2}$ is unusually large. This disadvantage is avoided in the following examples.

| 2. Sample calculation: $\Delta\lambda = 1$ nm, $\Lambda_0 = 236.6752$ nm, $\theta_1 = 3°$ | | | |
|---|---|---|---|
| $\lambda_1 = 1.550$ μm | $\Lambda_1 = 237.0000$ nm | $\theta_1 = 3.0000°$ | |
| | | | $\Delta\theta_{12} = 0.64°$ |
| $\lambda_2 = 1.551$ μm | $\Lambda_2 = 237.1529$ nm | $\theta_2 = 3.6373°$ | |
| | | | $\Delta\theta_{23} = 0.54°$ |
| $\lambda_3 = 1.552$ μm | $\Lambda_3 = 237.3058$ nm | $\theta_3 = 4.1780°$ | |
| | | | $\Delta\theta_{34} = 0.48°$ |
| $\lambda_4 = 1.553$ μm | $\Lambda_4 = 237.4587$ nm | $\theta_4 = 4.6560°$ | |

This example corresponds to FIGS. 2 and 3. The angle difference $\Delta\zeta_{i,i+1}$ is much more homogeneous and has a much more advantageous distribution.

| 3. Sample calculation: $\Delta\lambda = 1$ nm, $\Lambda_0 = 235.7017$ nm, $\theta_1 = 6°$ | | | |
|---|---|---|---|
| $\lambda_1 = 1.550$ μm | $\Lambda_1 = 237.0000$ nm | $\theta_1 = 6.000°$ | |
| | | | $\Delta\theta_{12} = 0.34°$ |
| $\lambda_2 = 1.551$ μm | $\Lambda_2 = 237.1529$ nm | $\theta_2 = 6.342°$ | |
| | | | $\Delta\theta_{23} = 0.32°$ |
| $\lambda_3 = 1.552$ μm | $\Lambda_3 = 237.3058$ nm | $\theta_3 = 6.666°$ | |
| | | | $\Delta\theta_{34} = 0.31°$ |
| $\lambda_4 = 1.553$ μm | $\Lambda_4 = 237.4587$ nm | $\theta_4 = 6.974°$ | |

This example also corresponds to FIGS. 2 and 3. The angle difference $\Delta\zeta_{i,i+1}$ is greatly reduced by increasing the size of the initial angle $\zeta_1$ (6° here in comparison with 3° in Example 2).

| 4. Sample calculation: $\Delta\lambda = 4$ nm, $\Lambda_0 = 234.6935$ nm, $\theta_1 = 8°$ | | | |
|---|---|---|---|
| $\lambda_1 = 1.550$ μm | $\Lambda_1 = 237.0000$ nm | $\theta_1 = 8.000°$ | |
| | | | $\Delta\theta_{12} = 0.989°$ |
| $\lambda_2 = 1.554$ μm | $\Lambda_2 = 237.6116$ nm | $\theta_2 = 8.989°$ | |
| | | | $\Delta\theta_{23} = 0.886°$ |
| $\lambda_3 = 1.558$ μm | $\Lambda_3 = 238.2232$ nm | $\theta_3 = 9.875°$ | |
| | | | $\Delta\theta_{34} = 0.810°$ |
| $\lambda_4 = 1.562$ μm | $\Lambda_4 = 238.8348$ nm | $\theta_4 = 10.685°$ | |

This example also corresponds to FIGS. 2 and 3 and shows that even a large wavelength difference can be implemented.

| 5. Sample calculation: $\Delta\lambda = 4$ nm, $\Lambda_0 = 234.6935$ nm, $\theta_1 = 8° = \phi$ | | | | |
|---|---|---|---|---|
| $\lambda_1 = 1.550$ μm | $\Lambda_1 = 237.0000$ nm | $\theta_1 = 8.000°$ | $\alpha_1 = 0.00°$ | |
| | | | | $\Delta\alpha_{12} = 0.99°$ |
| $\lambda_2 = 1.554$ μm | $\Lambda_2 = 237.6116$ nm | $\theta_2 = 8.989°$ | $\alpha_2 = 0.99°$ | |
| | | | | $\Delta\theta_{23} = 0.89°$ |
| $\lambda_3 = 1.558$ μm | $\Lambda_3 = 238.2232$ nm | $\theta_3 = 9.875°$ | $\alpha_3 = 1.88°$ | |
| | | | | $\Delta\theta_{34} = 0.81°$ |
| $\lambda_4 = 1.562$ μm | $\Lambda_4 = 238.8348$ nm | $\theta_4 = 10.685°$ | $\alpha_4 = 2.69°$ | |

This example corresponds to FIGS. 4 and 5, insofar as the grating is tilted by the angle with respect to the border of the grating. Achieving smaller angles $\alpha_i$ is demonstrated here.

6. Sample calculation: $\Delta\lambda = 4$ nm, $\Lambda_0 = 234.6935$ nm, $\phi = (\theta_2 + \theta_3) \cdot 0.5$

| | | | |
|---|---|---|---|
| $\lambda_1 = 1.550$ μm | $\Lambda_1 = 237.0000$ nm | $\theta_1 = 8.000°$ | $\alpha_1 = +1.435°$ |
| | | | $\Delta\alpha_{12} = 0.995°$ |
| $\lambda_2 = 1.554$ μm | $\Lambda_2 = 237.6116$ nm | $\theta_2 = 8.989°$ | $\alpha_2 = +0.44°$ |
| | | | $\Delta\alpha_{23} = 0.880°$ |
| $\lambda_3 = 1.558$ μm | $\Lambda_3 = 238.2232$ nm | $\theta_3 = 9.875°$ | $\alpha_3 = -0.44°$ |
| | | | $\Delta\alpha_{34} = 0.990°$ |
| $\lambda_4 = 1.562$ μm | $\Lambda_4 = 238.8348$ nm | $\theta_4 = 10.685°$ | $\alpha_4 = -1.435°$ |

This example corresponds to FIGS. 4 and 5. Very small angles sol are achieved by means of symmetrical tilting of the waveguides ($\alpha_2 = -\alpha_3$, $\alpha_1 = -\alpha_4$).

7. Sample calculation: $\Delta\lambda = 4$ nm, $\Lambda_0 = 237$ nm

| | | |
|---|---|---|
| $\lambda_1 = 1.550$ μm | $\Lambda_1 = 237.0000$ nm | $\theta_1 = 0.0000°$ |
| | | $\Delta\alpha_{12} = 0°$ |
| $\lambda_2 = 1.554$ μm | $\Lambda_2 = 237.6116$ nm | $\theta_2 = 4.1118°$ |
| | | $\Delta\alpha_{23} = 0°$ |
| $\lambda_3 = 1.558$ μm | $\Lambda_3 = 238.2232$ nm | $\theta_3 = 5.9087°$ |
| | | $\Delta\alpha_{34} = 0°$ |
| $\lambda_4 = 1.562$ μm | $\Lambda_4 = 238.8348$ nm | $\theta_4 = 7.1066°$ |

This example corresponds to FIGS. 9 and 10. $\alpha_i = 0$ is achieved by individual tilting of each of the grating fields.

The following advantages can be achieved with the proposed embodiments of this invention:

Extremely precise definition of the difference in the characteristic wavelength between one waveguide and the next.

A phase shift in the grating may extend over several waveguides in the simplest case because the amount of the phase shift does not depend on the tilt angle (FIGS. 2, 4, 6 and 7).

a possible reduced influence of the end facet or end facet reflection when the waveguide is not vertical with regard to the borders of the grating or components.

The possibility of a very inexpensive and accurate definition of the difference between the characteristic wavelengths of one waveguide and the next, for example, when holographic methods are used for the grating definition. This is true not only of a waveguide running over a large grating field (FIG. 6, for example) but also of several grating fields (FIGS. 9 to 11). An excellent means of producing these grating fields is by the holographic method, which is also very inexpensive. The grating fields are defined in succession, for example, and before the implementation of each field i, the orientation of the semiconductor layer structure on which the grating is to be created is realigned and offset by the angle $\phi_i$.

This method is especially suitable for producing small wavelength differences in neighboring waveguides that are difficult to produce by other methods.

This method can be used regardless of the specific designs of different photonic components. (However, these components must be based on optical feedback gratings.)

This method can yield an inclined or perpendicular alignment of the waveguides relative to the preferential directions. The perpendicular alignment is more advantageous for optical coupling of several glass fibers or a coupler element.

What is claimed is:

1. Optoelectronic multi-wavelength component having a preferential direction comprising:

at least two optical waveguides for producing a desired wavelength $\lambda_i$ from each waveguide i;

an optical feedback grating for at least one of the optical waveguides; the optical feedback grating having grating lines, the grating lines intersecting the at least one optical waveguide at an angle between 40 and 140 degrees;

the grating lines of the feedback grating forming a border tilt angle with respect to the preferential direction;

a normal to the grating lines of the feedback grating forming a waveguide tilt angle $\zeta_i$ with respect to the waveguide i; and the waveguide tilt angle required for the desired wavelength $\lambda_i$ for a first-order grating for each waveguide i generally following the equation:

$\zeta_i = \arccos((\Lambda_0 \cdot 2 \cdot n_{eff,i})/(\lambda_i))$, where $\Lambda_0$ is a corrugation period of the optical feedback grating and $n_{eff,i}$ is the effective refractive index of the waveguide i.

2. The optoelectronic multi-wavelength component as recited in claim 1 wherein the optical feedback grating is a DBR grating.

3. The optoelectronic multi-wavelength component as recited in claim 1 wherein the optical feedback grating is a sampled grating.

4. The optoelectronic multi-wavelength component as recited in claim 1 wherein there exists at least two gratings areas side by side, one waveguide being assigned to each grating area, where the individual grating area are tilted differently with respect to the preferential direction.

5. The optoelectronic multi-wavelength component as recited in claim 1 wherein a plurality of the waveguides are assigned to each grating area.

6. The optoelectronic multi-wavelength component as recited in claim 1 wherein one of the waveguides intersects the grating lines at a right angle.

7. The optoelectronic multi-wavelength component as recited in claim 1 wherein none of the waveguides intersects the grating lines at a right angle.

8. The optoelectronic multi-wavelength component as recited in claim 1 wherein a plurality of the waveguides intersect the grating lines at a right angle.

9. The optoelectronic multi-wavelength component as recited in claim 1 wherein each optical waveguide i has a different waveguide tilt angle $\zeta_i$ to the grating lines.

10. The optoelectronic multi-wavelength component as recited in claim 1 wherein a plurality of the optical waveguides are arranged at the same waveguide tilt angle.

11. The optoelectronic multi-wavelength component as recited in claim 1 wherein the waveguide tilt angle $\zeta_i$ increases in the waveguide order i=1, 2, 3, ... n.

12. The optoelectronic multi-wavelength component as recited in claim 1 wherein the waveguide tilt angle $\zeta_i$ decreases in the waveguide order i=1, 2, 3, ... n.

13. The optoelectronic multi-wavelength component as recited in claim 4 wherein the corrugation period is constant within each grating area And is different between neighboring grating areas, where the grating lines of the different grating area, arranged side by side are tilted against the preferential direction.

14. The optoelectronic multi-wavelength component as recited in claim 1 wherein the grating lines run parallel to the preferential direction.

15. The optoelectronic multi-wavelength component as recited in claim 1 wherein the waveguides are at individual angles to the preferential direction.

16. The optoelectronic multi-wavelength component as recited in claim 1 wherein a phase shift occurs within a waveguide.

17. The optoelectronic multi-wavelength component as recited in claim 1 wherein at least one grating line is of different width than other grating lines so as to produce a phase shift in the corresponding waveguide.

18. The optoelectronic multi-wavelength component as recited in claim 1 wherein a phase shift is implemented by means of a specific local sectional change in the width of the waveguide.

19. The optoelectronic multi-wavelength component as recited in claim 1 wherein the waveguides have different widths.

20. The optoelectronic multi-wavelength component as recited in claim 1 wherein combinations of narrowing and widening of the waveguide are provided within a single waveguide.

21. The optoelectronic multi-wavelength component as recited in claim 1 wherein a coupling of the grating is complex and includes refractive index coupling and gain coupling.

22. The optoelectronic multi-wavelength component as recited in claim 1 wherein a coupling of the grating is complex and includes refractive index coupling and loss coupling.

23. The optoelectronic multi-wavelength component as recited in claim 1 wherein a coupling of the grating is purely imaginary and includes gain coupling.

24. The optoelectronic multi-wavelength component as recited in claim 1 wherein a coupling of the grating is purely imaginary and includes loss coupling.

25. The optoelectronic multi-wavelength component as recited in claim 1 wherein a coupling of the grating is real and includes pure index coupling.

26. The optoelectronic multi-wavelength component as recited in claim 1 wherein at least one waveguide is curved.

27. The optoelectronic multi-wavelength component as recited in claim 1 wherein at least one waveguide comprises straight sections and sections with an individual curvature.

28. The optoelectronic multi-wavelength component as recited in claim 1 wherein the waveguide tilt angle $\zeta_i$ and the angle between the waveguide and the preferential direction are both smaller than 50°.

29. The optoelectronic multi-wavelength component as recited in claim 1 wherein the border tilt angle $\phi$ is not equal to zero.

30. The optoelectronic multi-wavelength component as recited in claim 4 wherein the grating areas have different border tilt angles.

31. A method for manufacturing an optoelectronic multi-wavelength component having a preferential direction comprising the steps of:

forming at least one area having an optical feedback grating on the component, the optical feedback grating having grating lines and the grating lines of the feedback grating forming a border tilt angle with respect to the preferential direction;

forming at least two optical waveguides on the component, at least one waveguide forming a waveguide tilt angle $\zeta_i$ with the normal of the grating lines; and determining the waveguide tilt angle for a desired wavelength $\lambda_i$ for a first-order grating for each waveguide i by generally following the equation:

$\zeta_i = \arccos((\Lambda_0 \cdot 2 \cdot n_{eff,i})/(\lambda_i))$, where $\Lambda_0$ is a corrugation period of the optical feedback grating and $n_{eff,i}$ is the effective refractive index of the waveguide i.

32. The method as recited in claim 31 wherein areas of feedback gratings are formed holographically in succession.

33. The method as recited in claim 31 wherein areas of feedback gratings are contained on a semiconductor wafer and further comprising the step of rotating the semiconductor wafer to produce the waveguide tilt angles $\zeta_i$.

34. The method as recited in claim 31 wherein areas of feedback gratings are formed by electron beam lithography.

35. The method as recited in claim 31 wherein areas of feedback gratings are formed by ion beam lithography.

36. The method as recited in claim 31 wherein the waveguides are formed using a consistent lithography mask set having several optical waveguide patterns as well as suitable adjusting marks for definition of the waveguide tilt angles $\zeta_i$.

37. The method as recited in claim 31 wherein the waveguides are formed using a consistent lithography mask set having several optical waveguide patterns as well as suitable adjusting marks for definition of an angle between the at least one waveguide and the preferential direction.

38. The method as recited in claim 31 wherein the waveguides are formed on a photo-resist layer by optical mask lithography.

39. The method as recited in claim 31 wherein the waveguides are formed on a photo-resist layer by electron beam lithography.

40. The method as recited in claim 31 wherein the waveguides are formed on a photo-resist layer by ion beam lithography.

41. The method as recited in claim 31 wherein the waveguides are formed by ion beam lithography and subsequent regulated heating.

42. The method as recited in claim 31 wherein the waveguides are formed on a photo-resist layer by ion beam implantation and subsequent regulated heating.

* * * * *